US 6,574,764 B2

(12) United States Patent
Krech, Jr. et al.

(10) Patent No.: US 6,574,764 B2
(45) Date of Patent: Jun. 3, 2003

(54) ALGORITHMICALLY PROGRAMMABLE MEMORY TESTER WITH HISTORY FIFO'S THAT AID IN ERROR ANALYSIS AND RECOVERY

(75) Inventors: Alan S. Krech, Jr., Fort Collins, CO (US); Stephen D Jordan, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 106 days.

(21) Appl. No.: 09/842,433

(22) Filed: Apr. 25, 2001

(65) Prior Publication Data

US 2002/0162046 A1 Oct. 31, 2002

(51) Int. Cl.⁷ .............................................. G01R 31/28
(52) U.S. Cl. .................. 714/738; 712/240; 365/230.03; 714/38
(58) Field of Search ................................ 714/738, 724, 714/31, 38, 5, 45; 365/230.03, 233, 201; 712/238–241

(56) References Cited

U.S. PATENT DOCUMENTS 6,233,678 B1 * 5/2001 Bala ........................ 712/240
6,320,812 B1 * 11/2001 Cook et al. ............. 365/230.03
6,507,921 B1 * 1/2003 Buser et al. .................. 714/45

* cited by examiner

Primary Examiner—Albert Decady
Assistant Examiner—Guy Lamarre
(74) Attorney, Agent, or Firm—Edward L. Miller

(57) ABSTRACT

The problem is to branch back to an appropriate location within a memory tester test program, and also restore its state of algorithmic control, when an error associated therewith occurs later in time at the DUT. Owing to delays in pipelines connecting the program execution environment to the DUT and back again. These delays allow the program to arbitrarily advance beyond where the stimulus was given. The arbitrary advance makes it difficult to determine the exact circumstances that were associated with the error. A branch based on the error signal can restart a section of the test program, but it is likely only a template needing further test algorithm control information that varies dynamically as the test program executes. The solution is to equip the memory tester with History FIFO's whose depths are adjusted to account for the sum of the delays of the pipelines, relative to the location of that History FIFO. When the error flag is generated the desired program location and state information is present at the bottom of an appropriate History FIFO.

4 Claims, 4 Drawing Sheets

ALGORITHMICALLY PROGRAMMABLE MEMORY TESTER WITH HISTORY FIFO'S THAT AID IN ERROR ANALYSIS AND RECOVERY

REFERENCE TO RELATED APPLICATION

This disclosure is related to information appearing in U.S. patent application Ser. No. 09/665,892 entitled ERROR CATCH RAM FOR MEMORY TESTER HAS SDRAM MEMORY SETS CONFIGURABLE FOR SIZE AND SPEED, filed Sep. 20, 2000, now U.S. Pat. No. 6,320,812, and for the reasons given below is hereby expressly incorporated herein by reference. The subject matter of the instant disclosure concerns a portion of the operation of a rather large and complex system for testing semiconductor memories. The memory tester described contains within itself an extensive memory subsystem as a component in the overall paradigm for performing tests. Certain capabilities of that memory subsystem are of interest here, in that they serve as the preferred basis for some of the novel subject matter to be disclosed. For reasons of economy in the product, and abetted by the desire to have large amounts of memory available within the tester, a way was developed to use inexpensive memory (DRAM that is slow when randomly accessed) as a substitute for expensive SRAM that is fast even when randomly addressed. The result, when combined with various other memory subsystem features, is a very complex affair involving multiplexing among Groups and interleaving among Banks, as well as implementing such things as variable word width. On the one hand, the particular features we seek to disclose here could be implemented in a system using only SRAM, with a considerable reduction in complexity. There would be a considerable economic penalty, however, which would likely cause the finished product to be an engineering curiosity instead of a viable commercial technique. We have taken a middle ground in this disclosure, where we do not pretend to make the system entirely out of SRAM, although that would certainly be operable. We include the DRAM technique as a matter of course, but we have suppressed much of the messy detail about the internal operation of that DRAM technique, in favor of a modest description of its basic principles. Even a casual reader will conclude that much interesting material (e.g., the different interleaving and addressing schemes and their connection to the different modes of operation) has been omitted. However, every reader will, upon reflection, appreciate that the techniques and features that we seek to disclose do not fundamentally depend on that omitted material, even though they may, in some cases, be slightly influenced by it. So we have a case of ragged edges that are peripheral to the main issues of interest. The disclosure incorporated above supplies an abundance of detail concerning the DRAM technique. Those that feel that the instant disclosure raises more issues about the memory subsystem than it answers can go to the incorporated disclosure for those answers. It is for that reason that its existence has been made known by being incorporated herein by reference.

That said, there is a caveat for those who wish to combine the teachings of the two disclosures. The incorporated disclosure takes the view that the totality of the memory of interest is called an Error Catch RAM (ECR) and that it is divided into Memory Sets. This point of view works without difficulty in the incorporated disclosure, since in that disclosure an ECR is nearly the sole memory function of interest, even though the existence of other such functions is alluded to. However, upon reflection during the preparation of the instant application it was found to be more convenient to describe the totality of memory of interest using the term "Interior Test Memory," which is in turn composed of four separate and independent Memory Sets, within which the various functional memory mechanisms (including an ECR) could be defined by suitable configuration. So it would appear that in the incorporated disclosure Memory Sets are contained in an ECR, while herein it is the other way around. Nevertheless, both disclosures are directed to subject matters found in the same overall system. The difference is largely a matter of terminology, and any seeming inconsistency between the two disclosures vanishes when it is the lower level details of memory subsystem operation that are being considered. And it is to make those details available to the interested reader that we have pointed to that incorporated disclosure.

The subject matter of this disclosure is also related to that in U.S. patent application Ser. No. 09/702,631 filed Sep. 31, 2000 and entitled MEMORY TESTER WITH ENHANCED POST DECODE. In this Disclosure we make extensive use of a signal called PD_ERROR (90) that is central to the subject matter of an earlier filed case. And while we also give herein an abbreviated but sufficient account of what it means and of how it is generated, the complete details of the matter are considerably more complicated. As a hedge against the possibility that some confusion or seeming inconsistency may arise herein, and for brevity, we have accordingly chosen to incorporate MEMORY TESTER WITH ENHANCED POST DECODE herein by reference.

The subject matter of this disclosure is also related to that in U.S. patent application Ser. No. 09/677,202 filed Oct. 2, 2000 and entitled MEMORY TESTER TESTS MULTIPLE DUT'S PER TEST SITE. In this Disclosure we make reference to a certain collection of signals called FERR (113), PERR (114) and PD_ERROR (115). Their existence is central to the subject matter of one feature described herein, but their origin and original use is described in an earlier filed case. And while we also give herein an abbreviated but sufficient account of what they means and of how they are generated, the complete details of the matter are, as in the case above, considerably more complicated. Accordingly, we have again chosen to incorporate MEMORY TESTER TESTS MULTIPLE DUT'S PER TEST SITE herein by reference.

Background of the Invention

Electronics devices and capabilities have grown extremely common in daily life. Along with personal computers in the home, many individuals carry more than one productivity tool for various and sundry purposes. Most personal productivity electronic devices include some form of non-volatile memory. Cell phones utilize non-volatile memory in order to store and retain user programmed phone numbers and configurations when the power is turned off. PCMCIA cards utilize non-volatile memory to store and retain information even when the card is removed from its slot in the computer. Many other common electronic devices also benefit from the long-term storage capability of non-volatile memory in un-powered assemblies.

Non-volatile memory manufacturers that sell to the electronic equipment manufacturers require testers to exercise and verify the proper operation of the memories that they produce. Due to the volume of non-volatile memories that are manufactured and sold at consistently low prices, it is very important to minimize the time it takes to test a single part. Purchasers of non-volatile memories require memory manufacturers to provide high shipment yields because of the cost savings associated with the practice of incorporating the memory devices into more expensive assemblies with minimal or no testing. Accordingly, the memory testing process must be sufficiently efficient to identify a large percentage of non-conforming parts and preferably all non-conforming parts in a single test process.

As non-volatile memories become larger, denser and more complex, the testers must be able to handle the increased size and complexity without significantly increasing the time it takes to test them. Memory tester frequently run continuously, and test time is considered a major factor in the cost of the final part. As memories evolve and improve, the tester must be able to easily accommodate the changes made to the device. Another issue specific to testing non-volatile memories is that repeated writes to cells of the memories can degrade the overall lifetime performance of the part. Non-volatile memory manufacturers have responded to many of the testing issues by building special test modes into the memory devices. These test modes are not used at all by the purchaser of the memory, but may be accessed by the manufacturer to test all or significant portions of the memories in as little time as possible and as efficiently as possible. Some non-volatile memories are also capable of being repaired during the test process. The tester, therefore, should be able to identify: a need for repair; a location of the repair; the type of repair needed; and, must then be able to perform the appropriate repair. Such a repair process requires a tester that is able to detect and isolate a specific nonconforming portion of the memory. In order to take full advantage of the special test modes as well as the repair functions, it is beneficial for a tester to be able to execute a test program that supports conditional branching based upon an expected response from the device.

From a conceptual perspective, the process of testing memories is an algorithmic process. As an example, typical tests include sequentially incrementing or decrementing memory addresses while writing 0's and 1's into the memory cells. It is customary to refer to a collection of 1's and 0's being written or read during a memory cycle as a "vector", while the term "pattern" refers to a sequence of vectors. It is conventional for tests to include writing patterns into the memory space such as checkerboards, walking 1's and butterfly patterns. A test developer can more easily and efficiently generate a program to create these patterns with the aid of algorithmic constructs. A test pattern that is algorithmically coherent is also easier to debug and facilitates the use of logical methods to isolate portions of the pattern that do not perform as expected. A test pattern that is generated algorithmically using instructions and commands that are repeated in programming loops consumes less space in tester memory. Accordingly, it is desirable to have algorithmic test pattern generation capability in a memory tester.

Precise signal edge placement and detection is also a consideration in the effectiveness of a nonvolatile memory tester. In order to capture parts that are generally conforming at a median while not conforming within the specified margins, a non-volatile memory tester must be able to precisely place each signal edge relative in time to another signal edge. It is also important to be able to precisely measure at which point in time a signal edge is received. Accordingly, a non-volatile memory tester should have sufficient flexibility and control of the timing and placement of stimuli and responses from the Device Under Test (memory).

Memory testers are said to generate "transmit" vectors that are applied (stimulus) to the DUT (Device Under Test), and "receive" vectors that are expected in return (response). The algorithmic logic that generates these vectors can generally do so without troubling itself about how a particular bit in a vector is to get to or from a particular signal pad in the DUT, as the memory tester contains mapping arrangements to route signals to and from pins.

Memory testers have interior test memory that is used to facilitate the test process. This interior test memory may be used for several purposes, among which are storing transmit vectors ahead of time, as opposed to generating them in real time, storing receive vectors, and storing a variety of error indications and other information concerning DUT behavior obtained during testing. (There are also housekeeping purposes internal to the operation of the memory tester that use SRAM and that may appear to fall within the purview of the phrase "interior memory." These are private to the internal operation of the tester, tend to not be visible at the algorithmic level, and are comparable to internal control registers. That memory is described as "interior control memory," and is excluded from what is meant herein by the term "interior test memory," which we use to describe memory used to store bit patterns directly related to the stimulus of, and response from, the DUT.) It is easy to appreciate that this interior test memory needs to operate at least as fast as the tests being performed; a very common paradigm is for the interior test memory (or some portion thereof) to be addressed by the same address (or some derivative thereof) as is applied to the DUT. What is then stored at that addressed location in interior test memory is something indicative of DUT behavior during a test operation performed on the DUT at that address. Algorithmic considerations within the test program may mean that the sequence of addresses associated with consecutive transmit vectors can be arbitrary. Thus, the interior memory needs to have the dual attributes of high speed and random addressability. SRAM comes to mind immediately as being fast, easy to control and tolerant of totally random addressing. Indeed, conventional memory testers have used SRAM as their interior test memory.

Unfortunately, SRAM is quite expensive, and this has limited the amount of interior test memory with which memory testers have had to work. The result is limits on memory tester functionality that are imposed by a shortage of memory. DRAM is significantly less expensive, but cannot tolerate random addressing and still perform at high speed.

DRAM can replace SRAM as the interior test memory in a memory tester. As briefly described in a simplified overview below, the problem of increasing the speed of DRAM operation for use as interior test memory can be solved by increasing the amount of DRAM used, in place of increasing its speed. Numbers of identical Banks of DRAM are treated as Groups. A combination of interleaving signals for different Banks of memory in a Group thereof and multiplexing between those Groups of Banks slows the memory traffic for any one Bank down to a rate that can be handled by the Bank. (For the reader's convenience, we include a very abbreviated summary of this technique here, since much of its architectural aspects and associated terminology are useful in the explanation of the inventive subject matter that follows.) A three-way multiplexing between three Groups of four Banks each, combined with a flexible four-fold interleaving scheme for signal traffic to a Group produces an increase in operating speed approaching a factor of twelve, while requiring only three memory busses. A round robin strategy for choosing the next Group for the multiplexer is simple and assures that the interleaving mechanism for each Group has the time it needs to complete its most recently assigned task. All interleaved accesses within a Group are performed upon a next Bank (within that Group), also selected by a simple round robin selection. In this configuration, each of the twelve Banks represents a duplicate instance of the entire available address space, and any individual write cycle might end up accessing any one of the twelve Banks. An implication is that, at the conclusion of testing, all twelve Banks must be investigated to learn what failures happened during testing of the DUT, since the history of any address or collection of addresses of interest will be spread out across all twelve Banks. A particular channel is thus represented by twelve bits (one bit from each Bank and whose bit position within the word for that Bank is determined by the channel). It would be, however, awkward to have to (manually, as it were) individually consult all twelve Banks to discover failure information, so a utility mechanism has been provided to automatically "compose" (merge) results of all twelve Banks during a read cycle at an address into a unified result that can be stored in one or all twelve Banks. This allows composed data to later be read at full speed. Full speed in one embodiment is a 100 MHZ rate for randomly addressed memory transactions.

If 33 MHZ is fast enough, then random access can be supported with just the interleaving and no multiplexing, in which case the composition mechanism and the memory addressing scheme are suitably adjusted. The addressing scheme changes to include extra Group selection bits that allow the depth of the memory to be three times deeper than for random 100 MHZ operation. These two modes of operation are called R1001 and R33, respectively. There is also an L100 mode of 100 MHZ operation to single Banks that relies on well behaved addresses being sent to the DRAM (an absolute minimum of row address changes).

At the top level of interior test memory organization there are four Memory Sets, each having its own separate and independent address space and performing requested memory transactions. Two are of DRAM as described above, and two are of SRAM. Each Memory Set has its own controller to which memory transactions are directed. As to externally visible operational capabilities, all four Memory Sets are essentially identical. They differ only in their size of memory space and how they are internally implemented: The SRAM Memory Sets do not employ multiplexing and interleaving, since they are fast enough to begin with. Despite their independence, Memory Sets of the same type (of SRAM or of DRAM) may be "stacked," which is to say treated a one larger address space. This is done at the level of control above the Memory Sets themselves, in the algorithmic generation of the addresses and the decision as to which Memory Set to actually send a memory transaction. It is not as automatic as the way in which the Memory Sets and their controllers can stack groups to triple the address space as between the R100 and R33 modes of operation. For each of the Memory Set controllers, it has no clue that there even is such a thing as another Memory Set with another controller.

Thus it is that the interior test memory of the tester is divided into four Memory Sets, two of which are "internal" SRAM's and two of which are "external" DRAM's. To be sure, all this memory is physically inside the memory tester; the terms "internal" and "external" have more to do with a level of integration. The SRAM's are integral parts of a VLSI (Very Large Scale Integration) circuit associated with the tester's central functional circuitry, while the DRAM's are individual packaged parts mounted adjacent the VLSI stuff. The amount of SRAM is fairly small, (say, around a megabit per Memory Set) while the amount of DRAM is substantial and selectable (say, in the range of 128 to 1024 megabits per Memory Set). The SRAM Memory Sets are always present, and may be used for any suitable purpose, such as storing the expected content of a DUT that is a ROM (Read Only Memory). The DRAM Memory Sets are actually optional, and are typically used for creating a trace for subsequent analysis leading to repair, although there are also other uses. The tester does not enforce a distinction between the SRAM and DRAM Memory Sets, as to different purposes for which they may be used. Those distinctions arise mostly as a matter of size. The SRAM Memory Sets are small, while the DRAM Memory Sets are potentially huge. The person or persons creating the test programming make the decisions concerning how the various Memory Sets are to be used.

The memory tester we have been describing is heavily pipelined. By pipelined we mean that an overall task or functionality is spread over an essentially serial path comprising some number of mechanisms (stages of the pipeline), each of which can accept both input circumstances and then produce corresponding output at a common rate. So, for example, at the top of the pipeline leading "downward" to the DUT is a Micro-Controller Sequencer that is the algorithmically programmable origin of test program execution. It provides "raw" or "algorithmic level" address that are eventually applied to the DUT, but perhaps only after some considerable manipulation. Those address, and sometimes data, pass through some ALU's and (for addresses only) an Address Mapper may be applied to an Interior Test Memory and/or a Data MUX, and thence to an ADDRESS Bit Select circuit, a TRANSMIT VECTOR MAPPER/SERIALIZER & RECEIVE VECTOR COMPARE DATA Circuit, a Vector FIFO 45, and eventually to a Timing/Formatting & Comparison Circuit, where transmit vectors leave to be applied to the DUT via some Pin Electronics. Not all stages of the pipeline have the same delay. More complex operations in the pipeline toward the DUT might take more time within their associated stages. But, as with all the various stages, these are fixed delays, that once incurred, do not interfere with the overall end-to-end rate for the pipeline. We may say that there is yet another (and different) pipelined path that conveys receive vectors back "upward" toward the environment of the executing test program.

When the memory tester is configured a certain way for a particular segment of a test program, as opposed to a different segment in that same program, the change in configuration can add or delete stages in the pipeline, alter the length of a pipeline stage in use at that time, all of which can affect overall combined pipeline delay for that associated segment of the test program. Those combined delays will be known, however, and they will not change for the duration of their associated test program segments.

We mentioned earlier that an algorithmic capability was desirable in developing and maintaining the test programs that are to be executed with the memory tester. The Micro-Controller Sequencer supports a compact form of test program with loops nested within loops and branching on test results. The use of a pipelined architecture, however, complicates certain capabilities that we are interested in, particularly in the way that errors caused by DUT behavior are understood and handled.

Consider the basic need to know that "at this point in the program is where such and such a malfunction/unexpected result occurred. " Let's say that we ran the test program/DUT cycle rate slow enough that the pipeline delay from the Micro-Controller Sequencer to the Pin Electronics and then back again could simply be bundled into the slow rate of program execution. We would not even need to know that there was a pipeline. (And, it would be a pretty slow DUT, too!) Under these (mythical) circumstances, the current state of the test program and the activity at the DUT are in occurring not only in some time/rate relation to one another (synchronized), but also in a state of "sequential unison" where a cause and its effect are never separated by an instruction fetch for the test program. Under these rosy circumstances, if the DUT fails, the next step in the program can evaluate a response and decide then and there that the preceding step in the program is where the error occurred. What is done next would depend upon the programmer's intent. He may wish to simply gather (report or preserve) for later consideration or analysis the basic information, such as what were the applied addresses and other relevant stimulus information that, in addition to knowing that "it was that step in the program" (as indicated by a program pointer and perhaps some loop indices) where the evil occurred. Alternatively, the programmer may have anticipated that this might happen and has already provided yet other test program segments whose execution is intended to deal with whatever it is. So the program would branch to someplace. Both of these desirable actions are indeed possible in this contrived example, because the property of "sequential unison" ensures that a cause (some stimulus in the test program) and its effect (some corresponding result from the DUT) are never separated by an instruction fetch for the test program.

But the DUT's to be tested are not that slow, and the operator of the memory tester wants to test them at the speeds at which they will be used. Furthermore, the test program might not enquire immediately as to whether or not an earlier stimulus produced an associated error. Aside from building super fast hardware to retain the property of sequential unison, we have no real other choice but to allow the delays of the pipelines to become visible. But the price we pay is that the answer to the basic question "where in the program did it fail . . . " is a good deal tougher to provide, as are the mechanisms needed to allow the task of branching on an error. In any case, the test program at the top of the pipeline will have already advanced beyond the place where it provided the stimulus. It may have already provided several such stimuli, and it may have undergone conditional branching since then. Even when an error flag does eventually get set and is later tested by the program, just which event is it correlated with? And what were the various address, etc. at that point it time? They are most likely different now than they were then. It is a lot of trouble to back all that stuff up and find out. How can we deal effectively with the fact that events in the test program are running ahead of the effects they are causing in the DUT? If this cannot be resolved it will be a rather significant wart on the memory tester.

What to do?

SUMMARY Of THE INVENTION

The problem is to branch back to an appropriate location within a memory tester test program, and also restore its state of algorithmic control, when an error associated therewith occurs later in time at the DUT. Owing to delays in a transmit vector pipeline connecting address and data stimuli from the program execution environment to the DUT and also owing to further delays in a receive vector pipeline connecting responses from the DUT back to the execution environment of the test program, these delays allow the program to arbitrarily advance beyond where the stimulus was given. The arbitrary advance makes it difficult to determine the exact circumstances that were associated with the error. A branch based on the error signal can restart a section of the test program, but it is likely only a template needing further test algorithm control information that varies dynamically as the test program executes. The solution is to equip the memory tester with various History FIFO's whose depths are adjusted to account for the sum of the delays of the transmit and receive vector pipelines, relative to the location of that History FIFO. When the error flag is generated the desired program state and algorithmic control information is present at the bottom of an appropriate History FIFO, and can be used as desired. This technique is readily applicable to the case where the test program uses an ALU to generate its own DUT stimuli (is entirely self-contained), as well as to the case where the test program/ALU addresses an intermediate Buffer Memory whose contents are central to the nature of the testing the DUT is to undergo. In the first case there is an ALU History FIFO, while in the second there is a Buffer Memory History FIFO. (The term "History FIFO" is a generalization and the name of a class of particular FIFO's. There is no FIFO named "History FIFO"; there are only the specific members of the class.)

Furthermore, the writer of test programs would most certainly prefer not to be bothered with discovering the various pipeline depths that ensue for different memory tester configurations that are arranged by the program for different tests that are performed. Accordingly, there is a mechanism to track configuration as it occurs and adjust the depths of the various History FIFO's accordingly. There also needs to be some "start" mechanism at the test program level to indicate when a stimulus is being issued for which there will later be a check for an associated error, as the degree to which a History FIFO is filled to a desired depth-in-use is determined subsequent to that "start" indication.

The test program might not enquire if there was an error for quite some time after the associated stimulus. If a History FIFO is allowed to continue to store new stimuli in the interim, but after an error occurs, the desired correspondence will be lost. Accordingly, there is a mechanism to freeze the contents of a History FIFO upon the generation of an error.

ECR's (Error Catch RAM's) are often filled during actual DUT testing and then later investigated with further test program activity that does not actually exercise the DUT. The various pipeline delays can make it awkward to determine the address that was applied to the DUT that produced a particular error indication logged in the ECR. The conventional utility operations provided for this are too slow. The History FIFO mechanism can be applied to ECR investigations and an ECR History FIFO will provide the answer without incurring any time penalty.

Finally, the overhead needed to implement a History FIFO can be extended to allow a branching instruction in the test program to not prematurely respond to an error flag sooner than the pipeline delay needed for that error flag's value to be determined by a cause located within the test program.

DESCRIPTION OF A PREFERRED EMBODIMENT

Figure 1:
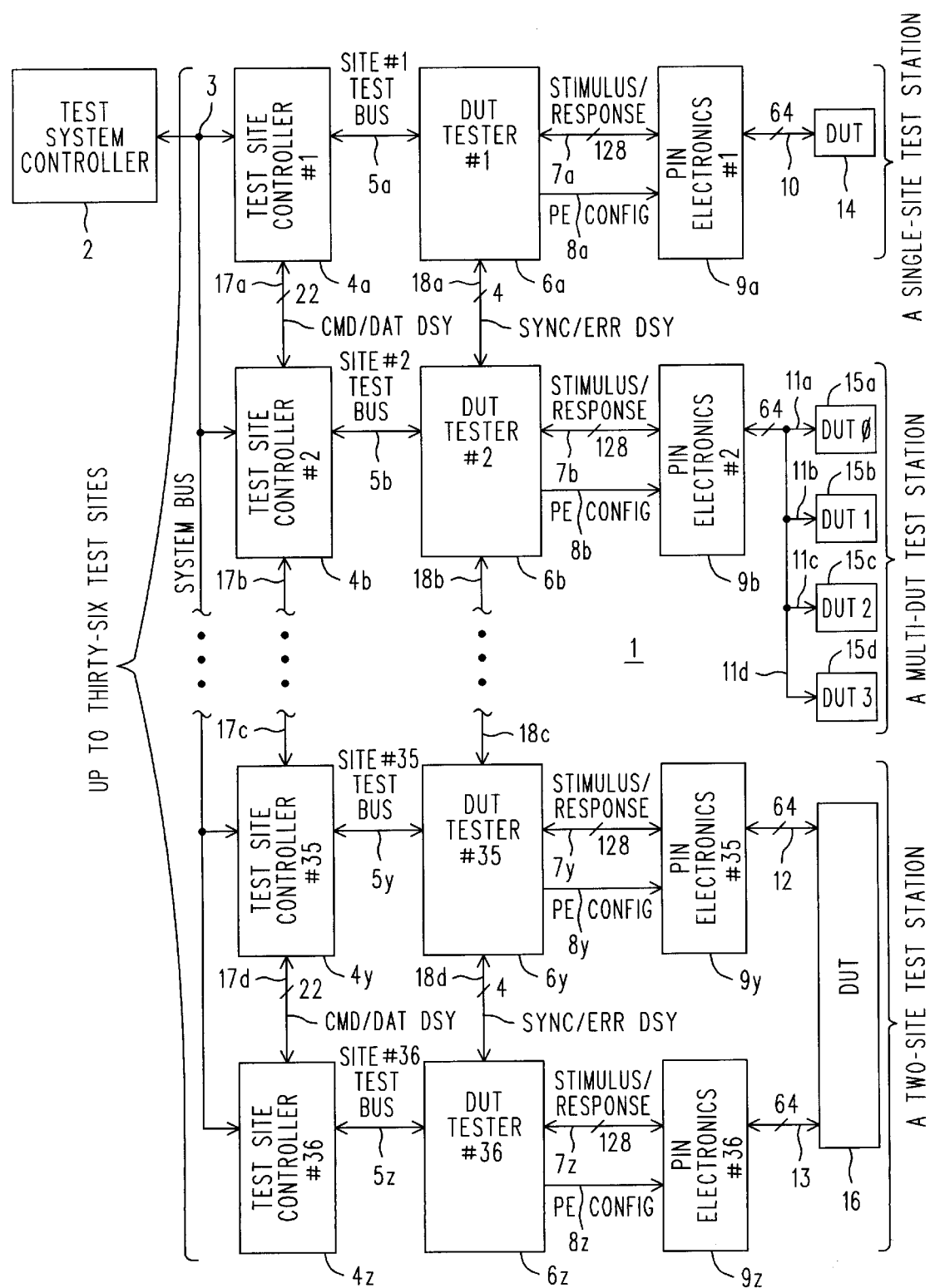
FIG. 1 is a simplified block diagram of an extensively reconfigurable and algorithmically driven non-volatile memory tester constructed in accordance with the invention.

Refer now to FIG. 1, wherein is shown a simplified block diagram 1 of a Non-Volatile Memory Test System constructed in accordance with the principles of the invention. In particular, the system shown can simultaneously test, with as many as sixty-four test points each, up to thirty-six individual DUT's (Devices Under Test) at one time, with provisions for reconfiguration to allow elements of a collection of test resources to be bonded together to test DUT's having more than sixty-four test points. These test points may be locations on a portion of an integrated circuit wafer that has not yet been diced and packaged, or they might be the pins of a packaged part. The term "test point" refers to an electrical location where a signal may be applied (e.g., power supplies, clocks, data inputs) or where a signal can be measured (e.g., a data output). We shall follow the industry custom of referring to the test points as "channels". The "collection of test resources to be bonded together" referred to above may be understood as being as many as thirty-six test sites, where each test site includes a Test Site Controller (4), a (sixty-four channel) DUT Tester (6) and a (sixty-four channel) collection of Pin Electronics (9) that makes actual electrical connection to a DUT (14). In the case where testing the DUT requires sixty-four or fewer channels, a single Test Site is sufficient to perform tests upon that DUT, and we say, for example, that the Test Site #1 (as it appears in FIG. 1) forms or operates as a "Single Site Test Station". On the other hand, when some form of the aforementioned reconfiguration is in effect, two (or more) Test Sites are "bonded" together to function as one larger equivalent Test Site having one hundred and twenty-eight channels. Accordingly, and again in reference to an example shown in FIG. 1, we say that Test Sites #35 and #36 form a "two-Site Test Station".

Figure 2:
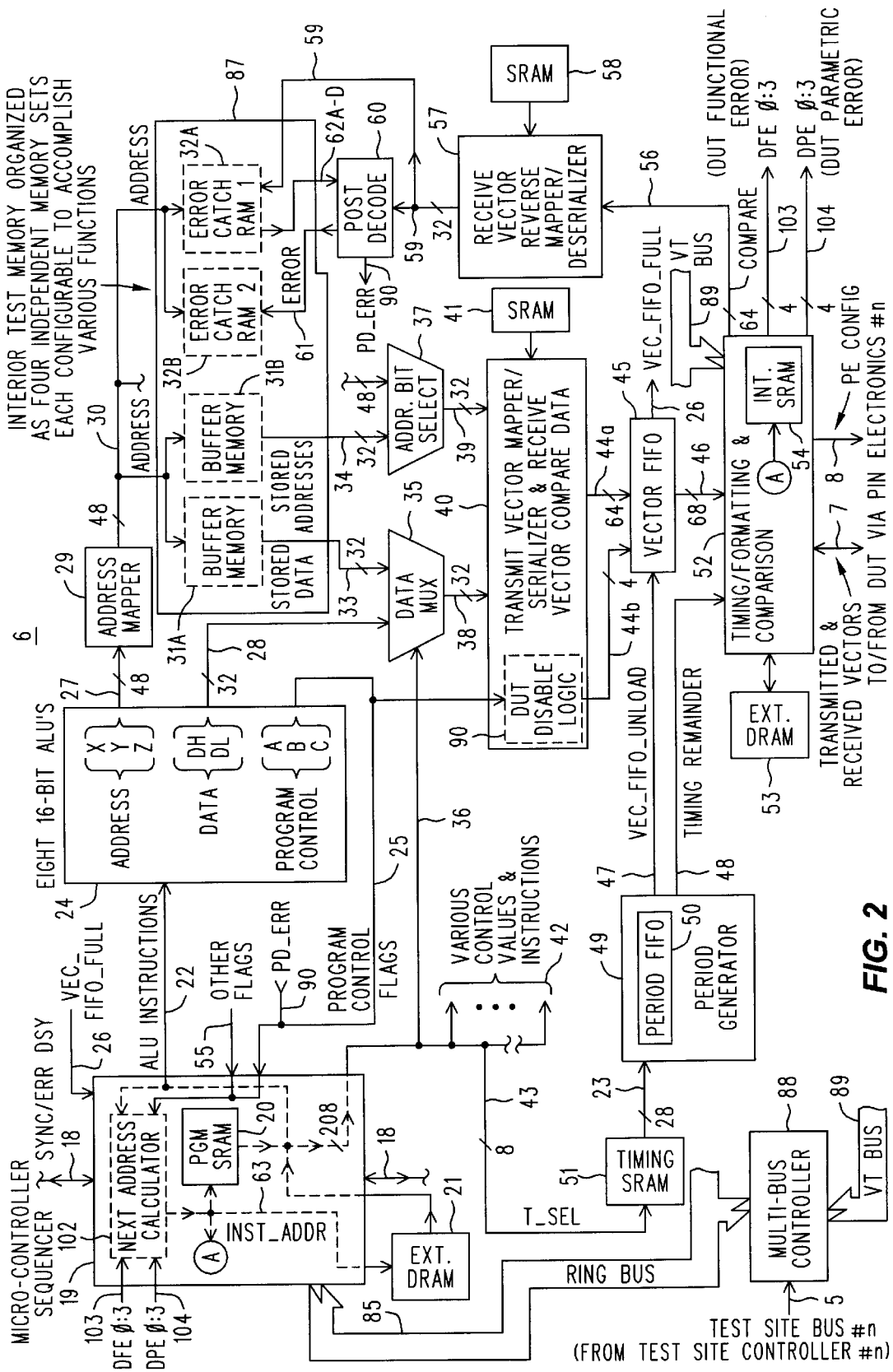
FIG. 2 is a simplified block diagram expansion of the DUT tester 6 of FIG. 1.

To briefly consider an opposing case, one should not assume that an entire Test Site is needed to test a single DUT, or that a single Test Site can test but a single DUT. Suppose that a wafer had two, three or four (probably, but not necessarily, adjacent) dies, the sum of whose test channel requirements were sixty-four channels or less. Such DUT's (15a–d) can be tested simultaneous by a single Test Site (e.g., Test Site #2 as shown in FIG. 2). What makes this possible is the general purpose programmability of each Test Site, as augmented by certain hardware features to be described in due course. In principle, a test program executed by the Test Site could be written such that one part of the Test Site's resources is used to test one of the DUT's while another part is used to test the other DUT.

After all, we would assume that if we had a third DUT that were the logical union of the first two, then we would be able to test that third DUT with a single Test Site, so we ought to be able to similarly test its "component DUT's", as it were. A major difference is, of course, individually keeping track of which of the two "component DUT's" pass or fail, as opposed to a simple unified answer for the "third" DUT.

That is, there is an issue concerning what portion of the "third" DUT failed. There are other issues as well, including removing or limiting the drive signals to a bad DUT, branching within the test program based on which DUT indicates failure, while at the same time preventing the test program from becoming hopelessly multi-threaded. Certain simple aspects of this "Multi-DUT Test Station" capability at a single Test Site are fairly simple, while others are complex. Multi-DUT testing should not be confused with the notion of bonding two or more Test Sites together.

Were it not for this notion of Test Site reconfiguration there would be no difference between a Test Site and a Test Station, and we would dispense with one of the terms. As it is, however, it will be readily appreciated that the number of Test Stations need not equal the number of Test Sites. In the past, the numbers could be different because Test Sites were sometimes split to create more Test Stations for simple Multi-DUT testing (DUT's not complex enough to consume an entire Test Site). Now, however, the difference may also be due to Test Sites having been bonded together to form multi-site Test Stations (DUT's too complex for a single Test Site).

To continue, then, a Test System Controller 2 is connected by a System Bus 3 to as many as thirty-six Test Site Controllers whose names end in the suffixes #1 through #36 (4a–4z). (It is true that subscripts a–z only go from one to twenty-six, and not to thirty-six. But this minor deception seems preferable over numerical subscripts on numerical reference characters, which would be potentially very confusing.) The Test System Controller 2 is a computer (e.g., a PC running NT) executing a suitable Test System Control Program pertaining to the task of testing non-volatile memories. The Test System Control Program represents the highest level of abstraction in a hierarchical division of labor (and of complexity) for accomplishing the desired testing. The Test System Controller determines which programs are being run by the different Test Sites, as well as overseeing a robotics system (not shown) that moves the test probes and DUT's as needed. Test System Controller 2 may function in ways that support the notion that some Test Sites are programmed to perform as single-site Test Stations, some as multi-DUT Test Stations, while others are bonded together to form multi-site Test Stations. Clearly, in such circumstances there are different parts being tested, and it is most desirable that different tests be used for the different parts. Likewise, there is no requirement that all single-site Test Stations be testing the same style of part, nor is there any such requirement for multi-site Test Stations. Accordingly, the Test System Controller 2 is programmed to issue the commands to accomplish the needed Test Site bonding and then to invoke the appropriate test programs for the various Test Stations in use. The Test System Controller 2 also receives information about results obtained from the tests, so that it may take the appropriate action for discarding the bad part and so that it may maintain logs for the various analyses that may be used to control, say, production processes in a factory setting.

The Test System itself is a fairly large and complex system, and it is common for it to use a robotics subsystem to load wafers onto a stage that then sequentially positions one or more future dies under probes connected to the Pin Electronics 9, whereupon those future dies (the wafer has not yet been diced) are tested. The Test System can also be used to test packaged parts that have been loaded onto a suitable carrier. There will be (as is explained below), at least one Test Site Controller associated with each Test Station in use, regardless of how many Test Sites are used to form that Test Station, or of how many Test Stations are on a Test Site. A Test Site Controller is an embedded system that may be an i960 processor from Intel with thirty-six to sixty-four MB of combined program and data memory running a proprietary operating system called VOS (VersaTest O/S), which was also used in earlier products for testing non-volatile memories (e.g., the Agilent V 1300 or V 3300). For the moment, we shall consider only the situation for single-site Test Stations. For the sake of a definite example, suppose that Test Site #1 is functioning as Test Station#1, and that it is to test the WHIZCO part no. 0013. The test regimen involves a hundred or so different types of tests (varying and monitoring voltage levels, pulse widths, edge positions, delays, as well as a large dose of simply storing and then retrieving selected patterns of information), and each type of test involves many millions of individual memory cycles for the DUT. At the highest level, the operators of the Test System instruct the Test System Controller 2 to use Test Station #1 to begin testing WHIZCO 0013's. In due course the Test System Controller 2 tells Test Site Controller #1 (4a) (which is an embedded [computer] system) to run the associated test program, say, TEST_WHIZ_13. If that program is already available within Test Site Controller #1's environment, then it is simply executed. If not, then it is supplied by the Test System Controller 2.

Now, in principle, the program TEST_WHIZ_ could be entirely self-contained. But if it were, then it would almost certainly be rather large, and it may be difficult for the processor of the embedded system within the Test Site Controller 4a to run fast enough to produce the tests at the desired speed, or even at a rate that is uniform from one DUT memory cycle to the next. Accordingly, low level subroutine type activities that generate sequences of address and associated data that is to be written or is expected from a read operation, are generated as needed by a programmable algorithmic mechanism located in the DUT Tester 6, but that operates in synchrony with the program being executed by the embedded system in the Test Site Controller 4. Think of this as exporting certain low level subroutine-like activity and the task of initiating DUT memory cycles out to a mechanism (the DUT Tester) that is closer to the hardware environment of the DUT 14. Generally speaking, then, whenever the Test System Controller 2 equips a Test Site Controller with a test program it also supplies the associated DUT Tester with appropriate low level implementation routines (perhaps specific to the memory being tested) needed to accomplish the overall activity described or needed by the programming for the Test Site Controller. The low level implementation routines are termed "patterns", and they are generally named (just as functions and variables in high level programming languages have names).

Each Test Site Controller #n (4) is coupled to its associated DUT Tester #n (6) by a Site Test Bus #n (5). The Test Site Controller uses the Site Test Bus 5 to both control the operation of the DUT Tester and receive therefrom information about test outcomes. The DUT Tester 6 is capable of generating at high speed the various DUT memory cycles that are involved in the test regimen, and it decides if the results of a Read memory cycle are as expected. In essence, it responds to commands or operation codes ("named patterns") sent from the Test Site Controller by initiating corresponding useful sequences of Read and Write DUT memory cycles (i.e., it executes the corresponding patterns). Conceptually, the output of the DUT Tester 6 is stimulus information that is to be applied to the DUT, and it also accepts response information therefrom. This stimulus/response information 7a passes between the DUT Tester 6a and a Pin Electronics #1 assembly 9a. The Pin Electronics assembly 9a supports up to sixty-four probes that can be applied to the DUT 14.

The above-mentioned stimulus information is just a sequence of parallel bit patterns (i.e., a sequence of "transmit vectors" and expected "receive vectors") expressed according to the voltage levels of some family of logic devices used in the DUT Tester. There is a configurable mapping between bit positions within a stimulus/response and the probes going to the die, and this mapping is understood by the DUT Tester 6. The individual bits are correct as to their timing and edge placement, but in addition to the mapping they may also need voltage level shifting before they can be applied to the DUT. Likewise, a response that originates in the DUT subsequent to a stimulus may need buffering and (reverse) level shifting before it can be considered suitable for being fed back to the DUT Tester. These level shifting tasks are the province of the Pin Electronics 9a. The Pin Electronics configuration needed for testing a WHIZCO 0013 likely will not work for testing a part from the ACME Co., and perhaps not even with another WHIZ Co. part. So, it will be appreciated that the Pin Electronics assembly needs to be configurable also; such configurability is the function of the PE Config lines 8a.

The above concludes a brief architectural overview of how a single Test Site is structured for testing a DUT. We turn now to issues that arise when there are many Test Sites with which to operate. As a preliminary, we shall describe a preferred embodiment for constructing a Test System having multiple Test Sites. In many respects, some of the information we are about to describe are matters of choice based on market studies of customer preference and cost benefit analyses. Be that as it may, to build one of these things one has to make definite choices, and once that is done there are particular consequences that are visible throughout the entire system. It is felt that it is useful to describe, at least in a general way, the larger outlines of the hardware properties of the Test System. Even though some of these properties are contingent, a knowledge of them will nevertheless assist in an appreciation of various examples used to illustrate the invention.

To begin, then, consider four rather large card cages. Each card cage has, besides power supplies and water cooling (fans can be a source of contamination in a clean room environment, and chilled water is cheaper than air conditioning to remove the several tens of KW of dissipated heat for a fully loaded system), a mother board, a front plane and a back plane. Into each card cage can be placed up to nine assemblies. Each assembly includes a Test Site Controller, DUT Tester and Pin Electronics. We shall be describing the general outlines of how Test Site Controllers are bonded together, which will involve some busses used to create daisy chains.

A brief digression concerning the term "daisy chain" is perhaps in order. Consider system elements A, B, C and D. Suppose that they are to be daisy chained together in that order. We could say that there is an information or control path that leaves A and goes into B, that B can selectively pass on traffic that then leaves B and goes into C, and that C can selectively pass on traffic that then goes into D. These same kind of arrangements can exist for traffic in the other direction, too. Daisy chains are often used to create priority schemes; we shall use them to create master/slave relationships between various the Test Site Controllers. We shall denote these daisy chained style communication arrangements with the suffix noun "DSY", instead of "BUS". Thus, we might refer to a Command/Data DSY instead of a Command/Data Bus. Now, the notion that information "enters B and is selectively passed on" may suggest that traffic is replicated onto a separate set of conductors before being passed on. It could be that way, but for performance reasons it is more like a regular bus having addressable entities. By means of a programmable address mapping arrangement and the ability to put portions of downstream Test Site Controllers "to sleep," the single bus can be made to logically appear (i.e., to function) as a plurality of daisy chains. Finally, it will be appreciated that the daisy chains are high performance pathways for command and control information, and that if they were not, then we could not expect a master/slave combination (multi-site Test Station) to operate as fast as a single Test Site does. For the benefit of daisy chain performance, the various DSY do not leave their respective card cages. The effect of this decision is to place some limits on which Test Sites (and thus also how many) can be bonded together. In principle, there is no fundamental need for this limitation, nor is there a genuine lack of technical practicality involved (it could be done); it is simply felt that, since there are already nine Test Sites in a card cage, extending the DSY's adds significant cost for relatively little additional benefit.

To resume our discussion of FIG. 1, then, consider the various Test Site Controllers 4a–4z that can populate the four card cages, each with nine Test Site Controllers. Let's denote them as 4a–4f, 4g–4m, 4n–4t and 4u–4z. (Never minding, as explained earlier, that these are nominally only twenty-six subscripts—the reader is invited to imagine that there are another ten subscript symbols in there, someplace.) A CMD/DAT DSY 17a (Command & Data Daisy Chain) interconnects the Test Site Controller 4a–4f that are in one card cage, while a different CMD/DAT DSY 17b interconnects the Test Site Controllers 4g 4m in another card cage. The same arrangement exists for the remaining card cages, and Test Site Controllers 4n–4t and 4u–4z, respectively. We have earlier said that the DSY do not leave the card cages, in that the "tail end" of a bus that actually forms the DSY does not leave a card cage and become the head of the next segment in another card cage. Instead, the System Bus 3 from the Test System Controller 2 goes to all Test Site Controllers, and each is capable of becoming a Master at the head of a DSY segment that does not leave the card cage. The CMD/DAT DSY 17a–d that we have been discussing exist between the various Test Site Controllers 4a–4z. There is a similar arrangement for the SYNC/ERR DSY 18a–18d and the DUT Testers 6a–6z. The synchronization and error information conveyed by the SYNC/ERR DSY 18 allows DUT Testers to function in unison. These two daisy chains (17 and 18) carry slightly different types of information, but each exists as part of the same general mechanism for bonding one or more Test Sites together into a Test Station.

We turn now to a discussion of FIG. 2, which is a simplified block diagram expansion of the DUT tester 6 of FIG. 1, of which there may be as many as thirty-six. It is sufficient at present to describe only one instance thereof. A glance at FIG. 2 will show that it is a fairly well populated with stuff; especially so for a "simplified" block diagram. Some of what is in the DUT Tester 6 and represented in the block diagram is functionally quite complicated, and is not available in "off the shelf" form. It is appropriate here to make two points. First, the primary purpose of including FIG. 2 is to describe the basic properties of an important operational environment within the overall Non-Volatile Memory Test System 1. The invention(s) that are fully described in connection with FIG. 3 and subsequent figures will either be expansions of mechanisms set out in the following description of FIG. 2, or they will be new mechanisms whose motivational premise is found in FIG. 2. Either way, as this is written it is not known exactly which of these is before the reader. The goal at present is to provide a simplified yet informative starting point for numerous different Detailed Descriptions of various Preferred Embodiments, so that each of those can be as concise as is appropriate (as opposed to one "jumbo" Specification that discloses everything about each different invention). The second point is that the expanded or extended material, while in general overall agreement with FIG. 2, may contain information that does not "match-up" exactly with the simplified version. This does not mean there has been an error, or that things are fatally inconsistent; it arises because it is sometimes difficult or impossible to simplify something such that it is the exact image in miniature. The situation is rather like maps. A standard size road map of Colorado will show that when going east on I-70 you can go north on I-25 at Denver. It looks like a left turn. And while it did used to be an actual left turn, it isn't one now, and a detailed map of that intersection will show a sequence of component turns and intervening road sections. But no one would say that the standard size road map is wrong; it is correct for its level of abstraction. Similarly, and despite its fairly busy appearance, FIG. 2 is indeed a simplification operating at a medium level of abstraction, but some seeming left turns are not simple left turns at all.

As is shown in FIG. 1, the major input to the DUT Tester 6 is an instance of the Test Site Bus 5, which originates from a Test Site Controller 4 that is associated with the instance of the DUT Tester 6 that is of interest. The Test Site Bus 5 is coupled to a Multi-Bus Controller 88 that converts traffic on the Test Site Bus to traffic on a Ring Bus 85 or a VT Bus 89. Ring Bus traffic can also converted to VT Bus traffic, and vice versa. Almost everything in FIG. 2 is part of some large scale integrated circuit; the Timing/Formatting & Comparison circuit 52 (described below) is actually eight such IC's, although we show it as one entity for the sake of brevity. Save for the various Ext. DRAM's (some of which are also part of the Interior Test Memory 87—see FIG. 3), most of the rest of the stuff in FIG. 2 is part of another large IC called the APG (Automatic Pattern Generator). The Ring Bus 85 is a general purpose inter-mechanism communication path for configuring the major elements within the APG portion of the DUT Tester 6, and for setting modes of operation, etc. There also various dedicated very wide and high speed paths between various elements of the APG. The VT Bus 89 is an IC to IC bus for use within the DUT Tester itself.

The Ring Bus 85 is the mechanism by which the Test Site Controller communicates with the APG portion of the DUT tester 6. The Ring Bus 85 is coupled to a Micro-Controller Sequencer 19, which may be likened to a special purpose microprocessor. Using an address created by a Next Address Calculator 102, it fetches instructions from a program stored in a program memory, which may be either internal to the Micro-Controller Sequencer 19 (PGM SRAM 20) or external thereto (EXT. DRAM 21). Although these two memories appear to be addressed by what is essentially a logically common address 63 that serves as a program counter (or, instruction fetch address), and either can be a source of programming to be executed, note that: (1) Only one of the memories performs instruction fetch memory cycles during any period of time; and (2) In fact they are addressed by electrically different signals. The SRAM is fast and allows genuine random access, but consumes valuable space within the Micro-Sequence Controller 19 (which is part of the large APG IC), so its size is limited. The external DRAM can be provided in adjustable amounts of considerable quantity, but is fast only when accessed in sequential chunks involving linear execution and no branching. Programming in the SRAM 20 is most often that which is intensely algorithmic, while the EXT. DRAM 21 is best suited for material not readily generated by algorithmic processes, such as initialization routines and random or irregular data. The Next Address Calculator 102 can implement branching in the test program being executed, in response to unconditional jump either instructions or conditional jump or conditional subroutine instructions conditioned on various PROGRAM CONTROL FLAGS (25), OTHER FLAGS (55), and certain other signals that, for clarity are shown separately (DFE 0:3 103 and DPE 0:3 104) and which are provided for multi-DUT operation.

The instruction word fetched and executed by the Micro-Controller Sequencer 19 is fairly wide: two hundred and eight bits. It consists of thirteen sixteen-bit fields. These fields often represent fetched instruction information for mechanisms that are outside the Micro-Controller Sequencer proper. Such fields are dedicated to their associated mechanisms. One set of ALU INSTRUCTIONS 22 are applied to a collection of eight sixteen-bit ALU's 24, while others are disbursed to various other mechanisms distributed throughout the DUT Tester. This latter situation is represented by the lines and legend "VARIOUS CONTROL VALUES & INSTRUCTIONS" 42.

The eight sixteen-bit ALU's (24) each have a conventional repertoire of arithmetic instructions built around associated sixteen-bit result registers (each ALU has several other registers, too). Three of these result registers and their associated ALU's are for generating X, Y and Z address components 27 that are variously combined into a complete address to supplied to the DUT. Two more of the eight ALU/registers (DH & DL) are provided to assist in the algorithmic creation of thirty-two bit data patterns 28 that are divided between a most significant portion (DH) and a least significant portion (DL). A final three ALU/registers (A, B, C) are used as counters and contribute to the production of various PROGRAM CONTROL FLAGS 25 that assist with program control and branching on completion of some programmatically specified number of iterations or other numerical condition. These PROGRAM CONTROL FLAGS 25 are sent back to the Micro-Controller Sequencer 19, where they affect the value of the instruction fetch address (created by Next Address Calculator 102) in ways familiar to those who understand about micro programmed execution mechanisms. There are also various OTHER FLAGS 55 that also can be used to effect program branching. These originate with various ones of the other mechanisms within the DUT Tester 6 that are controlled by the different fields of the fetched instruction word. One specific additional flag is expressly shown as a separate item: PD_ERR 90. It is supplied to the PGM SRAM 20, originates with the Post Decode mechanism 60, and indicates that the Post Decode mechanism 60 has discovered an error. Another such additional flag is VEC_FIFO_FULL 26. In another drawing having somewhat less detail it might be lumped in along with the OTHER FLAGS 55. We have separated it out to assist in explaining one aspect of the operation of the Micro-Controller Sequencer 19.

What VEC_FIFO_FULL does is to (temporarily) halt further program execution by the Micro-Controller Sequencer 19. There are many stages of pipeline between the instructions fetched by the Micro-Controller Sequencer 19 and the mechanism that finally hands test vectors off to be applied to the DUT. In addition, part of the baggage that accompanies a vector as it moves toward being applied to the DUT is information concerning the rate of eventual vector application, or, each vector's duration. Thus, the rate of vector application to the DUT need not be constant, and in particular, a Group of vectors may take longer to apply than they did to generate. The Micro-Controller Sequencer simply executes programming at its maximum rate. But clearly, on average, the rate of "vector consumption," as it were, must equal the rate of "vector production," lest the pipeline need to be elastic nearly without limit. There is a Vector FIFO 45 at the output of the Address Mapper 29 discussed below, and it serves as an elastic capacity in the pipeline. The signal VEC_FIFO FULL is used to prevent overrunning the limited number of stages in the pipeline, by causing a temporary cessation in the production of new vectors at the head end of the pipe.

To continue, the (three times sixteen equals forty-eight bits of) X, Y and Z address components 27 are applied to an Address Mapper 29, whose output is a selected-in-advance nearly arbitrary rearrangement of the address values in the ordered forty-eight bit address space. As a point of departure for appreciating this, suppose for a moment that the Address Mapper 29 were a memory that fully populated a forty-eight bit address space, and that it held a forty-eight bit value at each address. (Temporarily never mind that such a memory would—today anyway—be size of a large refrigerator.) Given such a memory, a look-up table could be implemented that could map any applied address into another, arbitrarily selected, forty-eight bit value which could then be used as a replacement address. The reason that such address mapping is desirable is that the X, Y and Z address components generally have useful meaning in the context of a particular DUT's internal architecture, which is most likely not implemented with one big linear decoder. The notions of rows, columns and layers, block or pages may be very useful to the Test Engineer, and failures that occur in locations that are physically close together may involve corresponding closeness in their X, Y and Z addresses. Such patterns in the test results can be valuable in appreciating what is wrong and in trying to fix it, whether at a design level or at a production level of reprogramming a part to shunt a defective section's operation with that of a spare section. Two issues arise from such thinking. The first is paring the forty-eight bits down to the actual number of bits (say, thirty-two, or perhaps sixteen) to be applied to the DUT. We shall shortly briefly mention how the paring down is done, and it is largely a matter of taking this many bits from X, that many from Y and the rest from Z. But not entirely, and this is the second issue, because certain addresses might lie within circuitry that is a left-for-right (or left-for-right and top-for-bottom) mirror image of another section of circuitry. This has the effect of rearranging what the bits mean, as far as what sequential address values are in physical order within that circuitry. This chip layout property may occur many times, and it may well be the case that how one Group of bits for, say, Y, are interpreted, may depend upon the accompanying value of some other, say, Z bits. The address mapper 29 is provided to allow the raw X, Y and Z addresses to be "repackaged," as it were, to reflect this sort of thing for the benefit of those who would test memories having such internal architectural arrangements. As to how its actually done, the Address Mapper 29 is constructed of a fairly large number of interconnected multiplexers. It cannot implement the completely arbitrary look-up table behavior of a fully populated memory decode scheme as was temporarily assumed above for purposes of explanation. It can however, rearrange sub-fields of the X, Y and Z address components as needed, particularly since there is yet another mechanism that will do the paring down from forty-eight bits to the actual number needed. The Address Mapper 29 also contains three sixteen bit (address) look-up tables that allow it to perform limited arbitrary mapping within local ranges.

The mapped address output 30 of the Address Mapper 29 is applied as an address to various Buffer Memories and/or Tag RAM's 31A–B and to Error Catch RAM1/2 (32A/B), which, while having separate functions, may nevertheless be implemented as selectable partitions in the four Memory Sets that are collectively the Interior Test Memory 87. The mapped address output 30 is also applied as one input to an Addr. Bit Select circuit 37, whose multiplexing function is described in due course. The Interior Test Memory can be configured to contain many instances of various RAM-based memory structures used for different functions. This is accomplished by declaring that certain portions of the different Memory Sets are to be used for the associated purposes. What is shown in FIG. 2 is one such arrangement; arrangements can be changed as testing proceeds, and this whole business of Memory Set usage should be considered to be very dynamic. None of the inhabitants of the Interior Test Memory (e.g., the error Catch RAM's 32A–B) are permanent hardware fixtures. What is permanent are the four Memory Sets. But which part of which Memory Set is an Error Catch RAM at any given time (if indeed there is even one defined) is dependent on whatever configuration has been established.

Consider the Buffer Memories 31A and 31B. Their functions are to retain data patterns 33 and addresses 34 that can be applied to the DUT. These are actual separate outputs from their associated Buffer Memories, although these Buffer Memories are not a dual "port memories," but are preferably composed of portions of two different Memory Sets. In keeping with this, it is preferred that Stored Data 33 is kept in one Memory Set, while Stored Addresses 34 are kept in another. Also, we have not shown an explicit mechanism for writing to a Buffer Memory. One way that may be accomplished is by an addressed bus operation initiated by a Test Site Controller 4 at the behest of the program it is executing. There is an "under the floorboards," as it were, "utility services" bus called the Ring Bus 85 that goes to just about everything in FIG. 2 (most of the visitations of which are not shown—as that would clutter the drawing immensely). Another and faster way of writing information to the Memory Sets is described in connection with FIG. 3.

The Error Catch RAM's 32A–B are addressed by the same address that is applied to the Buffer Memories, and they either store or retrieve information about errors, which operations are performed in conjunction with a Post Decode Circuit, to be discussed later. As with the paths 33 and 34 from the Buffer Memories 31A–B, paths 62A–D (from the Error Catch RAM1 32A) are preferably MUX'ed outputs from a portion of a Memory Set (configured to operate as an Error Catch RAM), in accordance with configuration information distributed by the Ring Bus (not shown).

Note that the Data MUX 35 has as inputs the STORED DATA output 33 from the Buffer Memory 31A as well as data 28 from the registers DH and DL in the collection 24 of ALU's. The Data MUX 35 performs an initial selection, in accordance with values 36 stored in PGM SRAM 20, of which of these inputs (28, 32) to present as its output 38, which, unless modified as described next, is then applied as one of two vector components to a Transmit Vector Mapper/Serializer/Receive Vector Compare Data Circuit 40 (the other component is the output 39 of the Addr. Bit Select circuit 37).

Circuit 40 can perform three vector related functions: assemble vector components (38, 39) into an ordered logical representation of an entire vector that is to be applied (transmitted) to the DUT; apply an arbitrary dynamic correspondence (mapping) between the ordered bits of the logical representation of the transmit vector and the actual physical channel number of the Pin Electronics (i.e., which probe tip) will contact the DUT on behalf of that signal (i.e., that bit in the vector); and, cooperate with the compiler in the division of an entire logical vector into pieces to be applied separately and in order (serialization) for DUT's that admit of such a thing. Which of these functions is performed is determined by control signals from an SRAM 41, which is also addressed in accordance with a field in the two hundred and eight bit instruction fetched by the Micro-Controller Sequencer 19.

Also contained within circuit 40 is a section of DUT Disable Logic 90. Its purpose is to respond to various conditions, some static, some contingent on test outcomes, but all defined programmatically, that indicate which one or more DUT's, among as many as four thereof, are to be disabled. These indications are carried by four signals DD 0:3 44b (DUT Disable for DUT Zero, for DUT One, etc.) This is in support of multi-DUT testing on a Test Site. The output of Circuit 40 is an up to sixty-four bit vector 44a that, along with the DUT Disable signals 44b, is applied to a Vector FIFO 45, which when full generates the signal VEC_FIFO_FULL 26, whose meaning and use was discussed above. The vector at the top of the Vector FIFO 45 is removed therefrom upon receipt of a signal VEC_FIFO_UNLOAD 47 that originates at a Period Generator 49 (to be discussed shortly). Such removed vectors (46) are applied to a Timing/Formatting & Comparison circuit 52 that is connected to the DUT via the associated instance of Pin Electronics 9. That is, each instance (among the various Test Sites) of Pin Electronics 9 receives Transmitted & Received Vectors 7 and Pin Electronics configuration information 8 from its associated Timing/Formatting & Comparison circuit 52.

The Timing/Formatting & Comparison circuit 52 is coupled to the VT Bus 89 to receive configuration and control information. It will be recalled that the Timing/Formatting & Comparison circuit 52 is actually eight IC's, which for our purposes we are treating as a single entity.

The Timing/Formatting & Comparison circuit 52 has an Internal SRAM 54 addressed by the same Instruction Address ("A" in the small circle) as is the Program SRAM 20 of the Micro-Controller Sequencer 19. (An External DRAM 53 may be used in place of the Internal SRAM 54, but is locally addressed by an incremented counter that is not shown.) The Internal SRAM 54 (or external DRAM 53) assists in the production of Drive and Comparison cycles, which have associated formats. Drive cycles apply a transmit vector to the DUT using a pre-selected format supplied by one of RAM's 54 or 53. Comparison cycles receive a vector presented by the DUT and examine it, also according to a pre-selected RAM-supplied format, to determine if it matches previously supplied comparison data. Both Drive and Comparison cycles are adjustable as to their duration, and appropriately adjustable as to whether and when a load is applied, when data is latched or strobed, if a signal is Return-To-Zero or not, whether to surround a driven signal with its complement, etc. (These options are the various formats mentioned above.)

The comparison produced by the Timing/Formatting & Comparison circuit 52 includes information, on a per channel basis, about whether a channel failed because a logical value was wrong (a functional error) and/or because its electrical properties are outside acceptable limits (a parametric error). Furthermore, when multiple DUT testing is performed it is known which channels are associated with which DUT's. This allows the production of the four signals DFE 0:3 (DUT # Functional Error) 103 and the four signals DPE 0:3 (DUT # Parametric Error) 104.

The comparison performed by the Timing/Formatting & Comparison circuit 52 also produces a sixty-four bit value 56 that is applied to a Receive Vector Reverse Mapper/Deserializer 57, whose function may be considered to be the logical inverse of circuit 40. (The operation of circuit 57 is controlled by an SRAM 58 that corresponds to the control of circuit 40 by SRAM 41.) In turn, the output 59 of circuit 57 is applied to the Post Decode circuit 60, and also to Error Catch RAM1 32A. At present, it is sufficient to say that the Post Decode circuit 60 can inspect via programmatic criteria both incoming error information 59 and error information previously stored in the Error Catch RAM1 32A to produce condensed and more readily interpretable error information which may then by stored back into the other Error Catch RAM2 32B via path 61. An example would be to create a count of how many times there was an error within a particular range of addresses, which information may be useful in deciding when to attempt to engage in on-chip repair by enabling substitute circuits.

We turn now to the Period Generator 49 and its associated Timing SRAM 51. These respond to an eight bit signal T_SEL 43 that, for each two hundred and eight bit instruction fetched by the Micro-Controller Sequencer 19, determines a duration for the associated operation of the Timing/Formatting & Comparison circuit 52. T_SEL 43 is member of the Various Control Values & Instructions 42 that are represented by the different fields within the fetched instruction. As an eight bit value it can represent or encode two hundred and fifty-six different things. In this case those "things" are twenty-eight bit values stored in the Timing SRAM 51 and that are addressed by T_SEL. Each addressed twenty-eight bit value (23) specifies a desired duration with a 19.5 picosecond resolution. The sequence of accessed twenty-eight bit duration values (23) is stored in a Period FIFO 50 so that the individual members of that sequence will be retrieved and applied in synchronism with the retrieval of their intended corresponding vector, which is stored in the Vector FIFO 45.

A coarse timing value field in the oldest entry in the FIFO 50 conveys duration information with a resolution of 5 nsec, and produces therefrom a signal VEC_FIFO_UNLOAD 47 that transfers the next transmit vector from the Vector FIFO 45 to the Timing/Formatting & Comparison circuit 52. A companion signal TIMING REMAINDER 48 is also applied to circuit 52. It is there that the ultimate resolution to 19.5 picoseconds is accomplished. The above concludes an introductory discussion of the overall nature of the memory tester. With that as a point of departure, we now turn our attention to the scope mode and its related topics.

Figure 3:
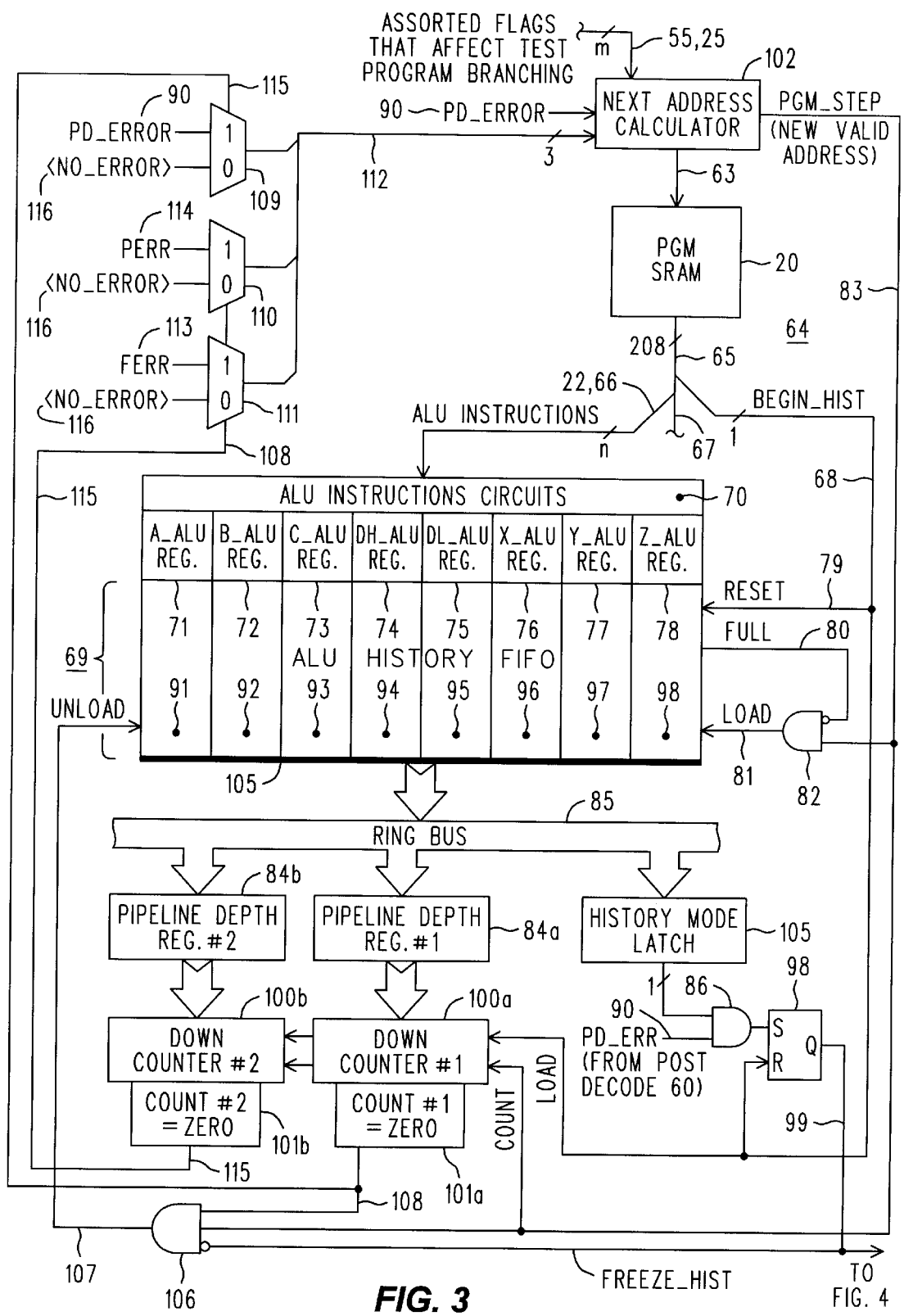
FIG. 3 is an expansion of portions of FIG. 2, showing the nature of an ALU History FIFO and its associated control circuitry.

Refer now to FIG. 3, which is a simplified block diagram 64 of an expansion of a portion of the block diagram 6 of FIG. 2 to include an ALU History FIFO 69 and related control circuitry. The best place to begin is with the Next Address Calculator 102, whose responsibility it is to create the sequence of addresses 63 applied to the PGM SRAM that stores the actual two hundred and eight bit instruction words that are executed by the hardware. That is, the Next Address Calculator 102 is the keeper of the program pointer that indicates the address from where the next instruction word is to be fetched. The signal PGM_STEP 83 is asserted each time there is a new valid address.

The Next Address Calculator 102 implements branching within a test program by responding with out-of-sequence addresses (63) when a machine word being executed permits such and the associated flag (55), program control variable (25), etc., is present. Among the signals of interest in this capacity is one called PD_ERROR 90 (Post Decode Error). It originates in the Post Decode Circuit 60 of FIG. 2, and is fully explained in the incorporated Application entitled MEMORY TESTER WITH ENHANCED POST DECODE. The short answer to the question "What does it mean?" is that Post Decode has determined that some configurable (within the Post Decode Circuit 60 itself) criteria for detecting an error has been met. What interests us at present is what test program location and relevant state information to associate with the onset of PD_ERROR 90. That is, we need to know the contents of the ALU Registers X, Y, and Z (addresses), perhaps the contents of the DH and DL Registers (they combine to be thirty-two bits of data), and perhaps also the contents of the A, B and C Registers (they can be used as loop indices or for other test program steering). To be able to recover the contents of those registers is why there is an ALU History FIFO 69. In some embodiments it may be sufficient to include only the address registers, while in others there may be additional registers not mentioned here that it would be useful to include in the ALU History FIFO 69.

The idea is that the test program will periodically test for the PD_ERROR signal, and will presumably be able to associate its presence with a need to JUMP to a particular location in the program. But it is most likely that the destination of the JUMP is really only a template for doing something, and that for the JUMP to do as intended the contents of various registers (the ones saved in the History FIFO) need to be restored. The destination of the JUMP, however, might not even be the true value of the program pointer whose instruction later "caused" the PD_ERROR of interest. In connection with these reasons, then, note that the value of the program pointer for the Next Address Calculator 102 is not among the items saved in the ALU History FIFO. Unlike a context switch in a microprocessor, we rely on a regular programmed JUMP to get the test program location set to where it needs to go. The ALU History FIFO, perhaps under program control, or perhaps automatically, restores a context of DUT addresses, DUT data and perhaps program loop control indices. In this way the outcome of an ALU History FIFO event can be flexibly directed by the very programming it effects.

To continue, the two hundred and eight bit instruction word 65 fetched from the PGM SRAM includes, for our present purposes, an n-bit portion describing ALU INSTRUCTIONS (22, 66) pertaining to ALU operation (think: "algorithmic control of test programs"). There is a one-bit portion 68 called BEGIN_HIST whose meaning and use we shall shortly describe below. The remaining portion 67 is whatever else is left of the two hundred and eight bits, and variously go wherever they need to go.

The ALU INSTRUCTIONS (22, 66) are applied to a collection of ALU Instruction Circuitry 70 that is appropriately connected to a collection of ALU Registers (71–78). These are the same ones as shown in FIG. 2, and as named here in FIG. 3 are: A_ALU Register 71; B_ALU Register 72; C_ALU Register 73; DH_ALU Register 74; DL_ALU Register 75; X_ALU Register 76; Y_ALU Register 77; and Z_ALU Register 78. It will be understood that for the sake of brevity we have not shown in FIG. 3 all the connections to these various registers; they continue to go to where they are shown as connected to in FIG. 2. Note, however, that each register is shown as abutting a section of the ALU History FIFO 69; indeed, the ALU History FIFO 69 has eight columns, fields or sections, the input to each one of which is one of the eight ALU Registers enumerated above. Since they will be operated in unison, the depths of each of these FIFO sections are all equal to one another. A depth of eighty-five or so is preferred, which figure arises from the sum of the lengths for the two pipelines, which is about forty each. At the bottom, the heavy black line 105 indicates that outputs of the eight FIFO sections are all collected and made available (during an UNLOAD operation) to the rest of the system via the Ring Bus 85.

ALU History FIFO 69 has four control signals that are of interest. These are a RESET signal 79 that sets an (internal) FIFO Load Pointer and an (internal) FIFO Unload Pointer to a starting value, and perhaps clears out all content. There is a LOAD signal 81 that causes the contents of the eight associated registers 71–78 to be loaded into their respective FIFO sections and the FIFO Load Pointer advanced. There is an UNLOAD signal 107 that causes the earliest loaded values to be extracted from the FIFO and the value of the Unload Pointer incremented. The extraction is to the Ring Bus, and thence to some intermediate, or perhaps final, destination. An alternative to unloading directly to the Ring Bus would be to store into some dedicated holding registers (not shown) whose content could then be conveyed wherever needed via the Ring Bus, or perhaps quickly transferred back into the ALU Registers proper via dedicated paths. These arrangements allow, under programmatic control, the inspection (if need be) and restoration of the values of those ALU registers of interest. It may be noted that an UNLOAD involves more bits than the width of the Ring Bus. This situation may be handled by first UNLOAD'ing to the associated dedicated holding registers (which can be fast), which may then be followed by a staggered transfer of the holding registers to the Ring Bus. If an UNLOAD is performed strictly to toss out data, then its associated staggered transfer can be omitted.

The remaining FIFO control signal is FULL 80, that indicates that there are no unloaded locations within the FIFO, and that any further loads will result in lost information (new stuff overwriting old stuff). We want to prevent that, as it is contrary to the purpose of the History FIFO, and we have made the FIFO deep enough to match the pipelines. Accordingly, the signal FULL is inverted and AND'ed with the source signal for LOAD (which turns out to be PGM_STEP 83), so as to prevent LOAD 81 from occurring whenever FULL 80 is TRUE. That AND'ing is performed by AND gate 82.

One more preliminary, and we shall put the ALU History FIFO into operation. As mentioned earlier, pipeline depths are not fixed for all time, but vary according to the operational configuration of the memory tester created for each particular need, which variations could occur at the level of consecutive segments of a test program. There is a housekeeping function performed by supervisory software that is connected with loading and executing test programs that takes care of knowing, for each segment of a test program, what the effective pipeline depth is (it knows because it is also the home of a collection of utilities used to make any configuration changes needed by the test program). This value will be placed by that supervisory software, initially and upon any changes thereto, into a Pipeline Depth Register 84a. From there it can be copied into a Down Counter 100a upon the occurrence of the signal BEGIN_HIST 68, which also resets the FIFO 69.

BEGIN_HIST 68 is essentially a flag embedded in the test program that manifests itself as a one-bit field in the two hundred and eight bit instruction word. Its meaning is that the instruction word of which it is a part, or one subsequent to it, is the location in the test program that the ALU History FIFO 69 is to later identify should a subsequently tested-for error flag (PD_ERROR 90) be TRUE. Another way to construe it is that we are prepared to toss out any previous history, and start a new one. So, at this point in the test program BEGIN_HIST 68 has been asserted and the FIFO 69 gets reset and the Down Counter 100a gets loaded with the effective pipeline depth from register 84a. (Another Down Counter 100b gets loaded from a Pipeline Depth Register #2, also. More about that later.)

Now, as further instructions from the PGM SRAM 20 are fetched and executed, there will be corresponding onsets for the signal PGM_STEP 83. These will cause corresponding instances of LOAD 81 for the FIFO (the FIFO is nowhere near full, yet) and corresponding instances of decrementing of the Down Counter 100a (note that PGM_STEP 83 goes to the COUNT terminal of the Down Counter 100a, as well as to 100b). Eventually the count in the Down Counter 100a will reach zero, and this will be indicated by an output from a Count #1=Zero Circuit 101a connected to the Down Counter 100a. What this condition means is that that the effective pipeline depth has reached, and that we should now cease letting the number of entries in the FIFO 69 increase in number, and begin keeping the FIFO depth-in-use constant. That way, if a PD_ERROR shows up we have what we need at the "FO" end of the FIFO.

If there has not yet been an instance of PD_ERROR 90, then it is safe to unload the FIFO once for each time we load it with a new value (a different collection of values will occupy the "FO" end of the History FIFO 69). All this means is that the BEGIN_HIST signal was earlier than otherwise, or perhaps that has not yet been a PD_ERROR (indeed, there might never be one). The LOAD/UNLOAD operation will keep the FIFO from getting full in any case. Still, we have yet to say how UNLOAD 107 gets generated, and will need to digress briefly.

There is a one-bit History Mode Latch 105 that can be set via the Ring Bus 85. Its meaning is that we wish to enable all this History FIFO control stuff that we are in midst of describing. Associated with the ALU History Mode Latch 105 is a set/reset latch 98 that is also reset by the signal BEGIN_HIST 83. What sets latch 98 is the signal PD_ERROR 90 whenever the ALU History Mode Latch 105 is set. This is accomplished by AND gate 86.

To resume, then, FIFO 69 is UNLOAD'ed each time there is a new instruction fetch (instance of PGM_STEP 83) while the Count #1=Zero Circuit 101a indicates that the FIFO 69 is now spanning the effective depth of the pipelines (the count is zero), and there has not yet been an instance of PD_ERROR. There might never be such an instance, but let's say that eventually there is. Now the Q output of Latch 98 gets set (its signal name is FREEZE_HIST 99), and its inversion at the input of AND gate 106 prevents any further production of the UNLOAD signal 107. We have now trapped the values of interest for registers 71–78; they are what we will get when we do the next UNLOAD. (Which will probably be when some software gets around to it. Also, we have not shown it, but the software can force an UNLOAD, to the Ring Bus or whatever, to obtain the desired values.) One might wonder at this point why it is not also advisable to disable LOAD'ing now, too. The answer is that it you could, but that it really does not matter, so long as the signal FULL 80 disables the production of LOAD, which is done by AND gate 82.

One might also wonder what happens if PD_ERROR occurs before Count #1=Zero . . . . That is indeed a good question. The short answer is that it is not supposed to ever, EVER(!) happen. If it does happen, it means that there has been some carelessness in the way the instances of BEGIN_HIST (which originate in the test program, recall) have been used, relative to setting the History Mode Latch 105 and configuring the Post Decode Circuitry 60 to produce (or perhaps reset) PD_ERROR 90. The situation is somewhat like a compiler looking for mismatched parentheses in a system that allows no nesting or overlapping of parenthetical expressions. (There is just the one set of History FIFO's, after all.)

Now that we have this ALU History FIFO mechanism for correlating an earlier existing program location and state with an error flag, we are tempted to use it for an additional purpose different than for which it was originally intended. To see how this goes, we ask the question "Why should this nifty mechanism be limited to just recovering ALU conditions upon a PD_ERROR? The ALU History FIFO incorporates a delay that matches the pipeline, and is there a way that we can use that to accurately test the value of an error signal or flag at (or even after) the time it happens, which is the pipeline delay after the associated instruction was fetched and executed? We already know where we were at." In this context, "accurately" means that we do not respond to an error signal or flag that occurs too soon, say, that got caused by something done a few cycles before the instruction we are interested in. The answer is that we can.

The error signals or flags we are interested in are these: FERR 113 (it means that there has been a Functional ERRor); PERR 114 (it means that there has been a Parametric ERRor); and (once again) PD_ERROR 90. The exact nature of how the first two of these signals are generated is in the incorporated MEMORY TESTER TESTS MULTIPLE DUT'S PER TEST SITE. See FIG. 5 of that case for how per DUT instances of functional error and parametric error signals are generated. Then see FIG. 6 therein to see how the system is configurable to produce YDFE (Yes DUT Functional Error) and YDPE (Yes DUT Parametric Error) that can represent a variety of possible combinations from among the associated component per/DUT signals. For our purposes, their YDFE is the same as our FERR, and their YDPE is the same as our PERR.

FERR and PERR likely have the same pipeline delay associated with their appearance, but that for PD_ERROR is quite probably different. In any event, the Pipeline Depth Register #2 84b would previously be set to the appropriate value for FERR and PERR, while Pipeline Depth Register #1 84a would previously be set to the appropriate value for PD_ERROR.

Now, at some step in the test program a stimulus is performed that may result in one of the afore-mentioned signals. At that same step the test program issues BEGIN_HIST 68. That loads the Down Counter 100b with the pipeline depth, which are then counted down by further steps in the program (successive instances of PGM_STEP 83). Eventually COUNT #2=ZERO 115 will go TRUE, which it will be noted, determines the selections made by two MUX's 110 and 111. MUX 109 is controlled by signal COUNT #1=ZERO 108.

Let us pick FERR 113 and its MUX 111 as an example; the others are the same in their manner of operation. As long as COUNT #2=ZERO is FALSE MUX 111 selects as its output (one bit of a three bit collection 112, sent to the Next Address Calculator for branching thereon) a signal <NO_ERROR> 116 that is the electrical value associated by the Test System with the absence of error. But, once the pipeline delay has run, it is fair to ask what the real FERR 133 is. That is what happens, because COUNT #2=ZERO goes TRUE, causing MUX 111 to now select FERR to be sent to the Next Address Calculator 102.

Branching on PERR works just as for FERR, but using MUX 110 instead. This style of branching on PD_ERROR 90 works just as the other two, except that it has its shares the delay for the ALU History FIFO (Pipeline Depth Register #1 84a) but has its own MUX 109 controlled by the signal COUNT #1=ZERO 108 that is driven by the "shared" Down Counter #1 100a.

To be sure, the test program has to be written in a manner that correctly takes advantage of this; a loop of fixed but sufficient delay, for example. But at least we are guaranteed that the correspondence is correct. We can even test significantly later that the expiration of the pipeline delay, provided that we ensure that no interloping cause gets in there and sets our signal on its own.

Figure 4:
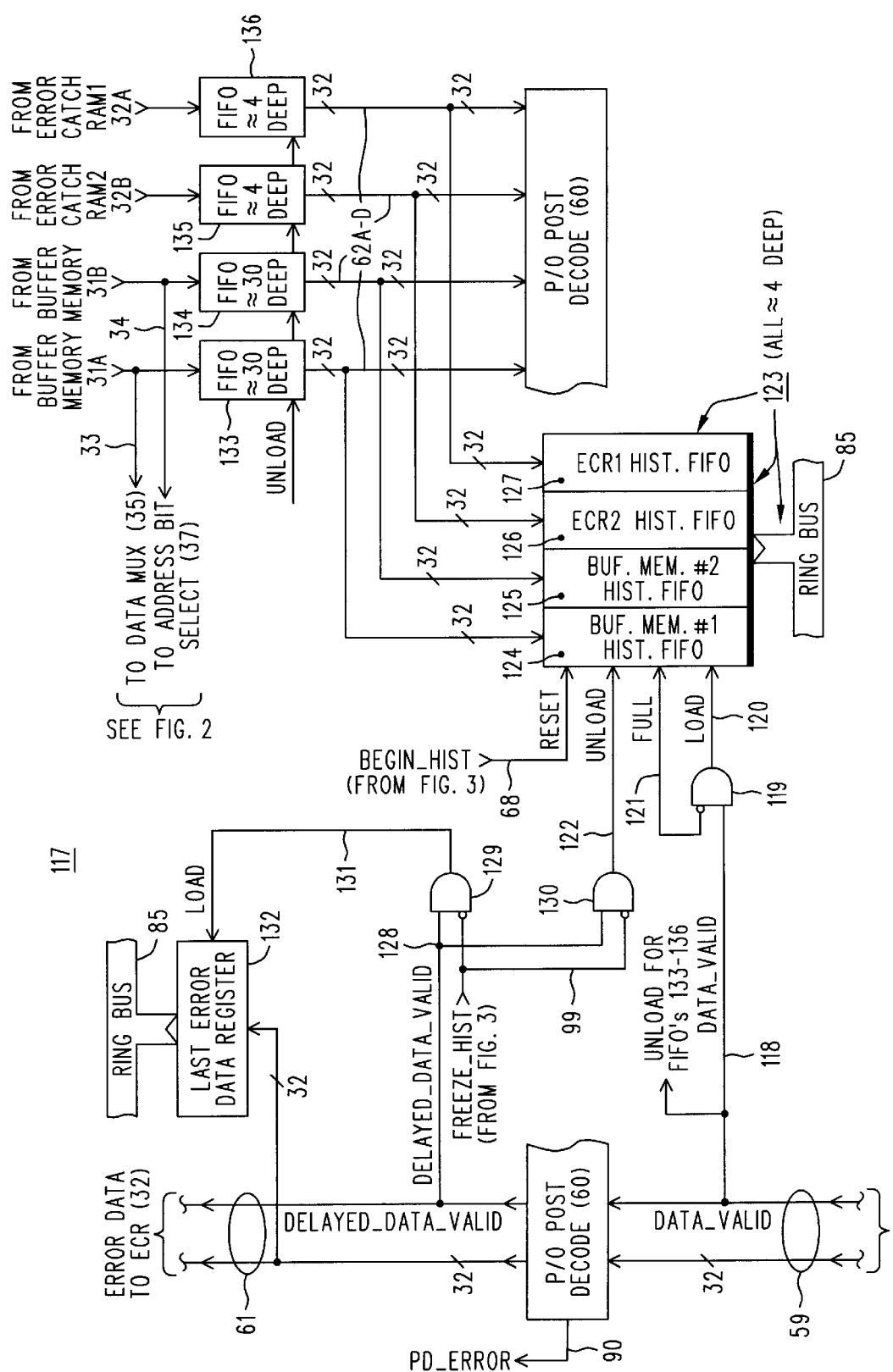
FIG. 4 is a simplified block diagram of portions of FIG. 2, showing the nature of a Last Error Data Register, a Buffer Memory History FIFO and an ECR History FIFO and their associated control circuitry.

There are other History FIFO's that are useful, and this is the subject matter of the simplified block diagram 117 FIG. 4. In general, they are going to work in ways that are similar to the way the ALU History FIFO 69 does, except that they are disposed in different part of the memory tester's architecture, and that they store answers to questions different from those stored by the ALU History FIFO. One FIFO for recording most recent compare error data is so situated that it need be only one level deep, and is thus simply a register rather than a full-blown FIFO. And there is one FIFO of two sections for recovering Buffer Memory history that is controlled in common with another two section FIFO for recovering ECR history.

Referring now to FIG. 4, the easiest place to begin is with left-hand portion. Note that a part of the Post Decode Circuit 60 is shown, and that true to what is depicted in FIG. 2, it receives thirty-two bits of comparison data 59 from the RECEIVE VECTOR REVERSE MAPPER/DESERIALIZER CIRCUIT (57). We have added one thing to that: the transmission of those thirty-two bits is accompanied by a DATA_VALID signal 118.

Emerging from Post Decode is thirty-two bits of (processed) error data and a DELAYED_DATA_VALID 128 {all of which is (61)} to be sent to ECR2 32B (see FIG. 2). Note also that Post Decode is where PD_ERROR 90 originates, and recall how it is used in FIG. 3 along with BEGIN_HIST 83 to produce FREEZE_HIST 99.

The task of trapping the error data 61 that caused a PD_ERROR is relatively straight-forward. Normally, FREEZE_HIST 99 is FALSE, and its inversion at the input of AND gate 129 allows DELAYED_DATA_VALID 128 to produce a signal 131 that is coupled to the LOAD control input of a Last_Error_Data Register 132. The data input to this register is exactly the thirty-two bits of error data being sent to ECR2, and it is thus captured each time such data is sent. A PD_ERROR causes FREEZE_HIST 99, which in turn prevents signal 131 and any further loads to register 132. The Last_Error_Data Register 132 is coupled to the Ring Bus 85, so that its contents may be investigated.

Now let us consider the History FIFO's that are associated with Buffer Memory usage. It will be recalled that Buffer Memories 31A and 31B can be used for various purposes, such as storing the expected content of a ROM, converting an applied sequence of addresses to another sequence, etc. In any event, once loaded a Buffer Memory is addressed by the Address Mapper 29, which is driven by the X, Y and Z addresses 27 produced by the ALU. We have two Buffer Memory History FIFO's (124 and 125), one for each Buffer Memory. It will be their task to provide us with correct pipeline-delayed Buffer Memory contents that are associated with the production of PD_ERROR 90. These two FIFO's are Buffer Memory #1 History FIFO (124), which is associated with Buffer Memory 31A, and Buffer Memory #2 History FIFO (125), which is associated with Buffer Memory 31B. These two Buffer Memory History FIFO's are each of the same depth (four is a good number), are controlled in common, and are connected to the Ring Bus (either directly or via intermediate registers, as explained for the connection of the ALU History FIFO to the Ring Bus). They are part of a larger History FIFO mechanism 123 that also includes the ECR History FIFO's 126 and 127, which will be discussed after the explanation for the Buffer Memory History FIFO's.

But before proceeding, we have a few more preliminaries to set out. Note the four FIFO's 133–136, and that their outputs are the 62A–D of FIG. 2. These outputs are coupled to the Post Decode Circuit 60, in keeping with FIG. 2, but notice also that the inputs for the Buffer Memory FIFO's 133 and 134 are also sent as STORED DATA (33) and STORED ADDRESSES (34) to circuitry (35 and 37) that is part of the ALU-to-DUT (transmit vector) pipeline (see FIG. 2). The FIFO's 133 and 134 for the Buffer Memories are fairly deep, say about 30; their actual depth in use is configurable, and is not of essential concern to us, except that we do well to appreciate why they are there. Indeed, they would be there even if there were no Buffer Memory History FIFO's. The reason for that arises from the way the Buffer Memories are used. They are an alternate source of what would otherwise come from the ALU, and one copy of their contents (33, 34) is sent "down" the ALU to DUT pipeline. However, another copy can be sent to Post Decode. It would not do for that other copy to get there way early (i.e., far ahead of compare data 59 coming back "up" from the DUT), so the FIFO's 133 and 134 provide the needed delay and make it such that things arriving at the same time actually correspond to one another. For this purpose they have depths of up to about thirty.

And now for the Buffer Memory History FIFO's 124 and 125. A number of its features of operation are the same as for the ALU History FIFO 69: They are reset by the BEGIN_HIST signal 68; They are LOAD'ed (via the outputs of FIFO's 133 and 134, respectively) by the assertion of a signal (DATA_VALID 118) that means a new value is present and needs to be put into the FIFO, but as AND'ed with the not FULL (signal 121) condition (AND gate 119). They are UNLOAD'ed in step with a delayed version of DATA_VALID (DELAYED_DATA_VALID 182). The delay in time between the two versions of DATA_VALID is essentially the time required for Post Decode to decide if there has been an error. If there has been no error, then we want to UNLOAD the FIFO's, but we have to wait to find out.

A difference in FIFO features is that the event (occurrence of PD_ERROR 90) that will cause the sequestration of the data in the FIFO (which is why we have it at all) is essentially contemporaneous (not separated by pipeline delays) with the data passing through the FIFO. Hence, we do not need the services of a Pipeline Depth Register, Down Counter, etc. It is sufficient to cease UNLOAD'ing upon FREEZE_HIST 99, which is really just PD_ERROR qualified with the History Mode Latch 105. Accordingly then, UNLOAD 122 is generated by an AND gate 130 whose inputs are DELAYED_DATA_VALID 182 and an inverted instance of FREEZE_HIST 99.

The operation of the ECR History FIFO's 126 and 127 are the same as far as the control signals are concerned. The key to appreciating why the depicted arrangement is useful is found in knowing something about how ECR's are used. Note that on FIG. 2 there is a bypass 59 around Post Decode 60 that allows actual data from a live test on a DUT to go straight into an ECR. At a later time the data stored in the ECR can be read back and applied to Post Decode for performance of various analyses. Now we ask the question "What data going into Post Decode caused PD_ERROR?" That is what the ECR History FIFO's can answer. The FIFO's 135 and 136 can be shallow for this process, since it is "local" and most of the rest of the big pipelines are not involved.

We claim:

1. A method of preserving the value of a parameter associated with testing a Device Under Test (DUT), the method comprising the steps of:

(a) executing in a program execution environment a test program that causes stimulus signal values to be dispatched to a DUT through a stimulus pipeline having a first number of stages;

(b) sending from the DUT to the program execution environment, and through a response pipeline having a second number of stages, response signal values obtained by operating the DUT with the dispatched stimulus signal values;

(c) for each execution cycle of the test program and from a selected location in one of the stimulus and response pipelines, storing in a History FIFO the value of the parameter that is to be retrieved;

(d) generating an error signal within the response pipeline, including at the DUT, in response to a selected error condition;

(e) adjusting the depth of the History FIFO to correspond to the number of pipeline stages separating the storing in step (c) and the generation of an associated instance of the error signal in step (d); and (f) in response to an error signal generated by step (d), preserving in the History FIFO the parameter value stored at the depth adjusted to at step (e).

2. A method as in claim 1 further comprising the step of:

(g) subsequent to step (f), retrieving the value of the parameter preserved in the History FIFO.

3. A method as in claim 2 wherein step (a) includes the generation of a Buffer Memory Address and further wherein the parameter of steps (c), (f) and (g) is the Buffer Memory Address.

4. A method as in claim 2 wherein the parameter of steps (c), (f) and (g) is response signal values that are in error.

* * * * *